(12) United States Patent
Park et al.

(10) Patent No.: US 9,874,809 B2
(45) Date of Patent: Jan. 23, 2018

(54) PELLICLE FOR A REFLECTIVE MASK AND REFLECTIVE MASK ASSEMBLY INCLUDING THE SAME

(71) Applicant: Samsung Electronics Co., Ltd., Suwon-si, Gyeonggi-do (KR)

(72) Inventors: Chang-min Park, Hwaseong-si (KR); Jin-hong Park, Yongin-si (KR); Myung-soo Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 15/183,846

(22) Filed: Jun. 16, 2016

(65) Prior Publication Data

US 2017/0068157 A1    Mar. 9, 2017

(30) Foreign Application Priority Data

Sep. 4, 2015    (KR) ........................ 10-2015-0125603

(51) Int. Cl.
*G03F 1/64*    (2012.01)
*G03F 1/24*    (2012.01)

(52) U.S. Cl.
CPC . *G03F 1/64* (2013.01); *G03F 1/24* (2013.01)

(58) Field of Classification Search
None
See application file for complete search history.

(56) References Cited

U.S. PATENT DOCUMENTS

| 6,337,161 | B2 | 1/2002 | Chiba et al. |
| 7,901,846 | B2 | 3/2011 | Kubota et al. |
| 8,535,545 | B2 | 9/2013 | Kim |
| 2003/0143472 | A1 | 7/2003 | Koizumi et al. |
| 2010/0279212 | A1* | 11/2010 | Shirasaki ................ G03F 1/64 |
| | | | 430/5 |
| 2014/0349219 | A1 | 11/2014 | Mizuno et al. |
| 2015/0168824 | A1 | 6/2015 | Sun et al. |

FOREIGN PATENT DOCUMENTS

| JP | 3411267 B2 | 5/2003 |
| JP | 4396354 B2 | 1/2010 |
| JP | 5724766 B2 | 5/2015 |
| KR | 10-0924330 B1 | 11/2009 |
| KR | 10-2011-0114299 | 10/2011 |

* cited by examiner

*Primary Examiner* — Stephen Rosasco
(74) *Attorney, Agent, or Firm* — Harness, Dickey & Pierce

(57) ABSTRACT

A pellicle for a reflective mask including a pellicle body, a light shielding pattern, a grating pattern, and a pellicle frame. The pellicle body includes a central region and a peripheral region, wherein the peripheral region surrounds the central region. The light shielding pattern is formed on the peripheral region of the pellicle body; the grating pattern is formed on the light shielding pattern, and the pellicle frame is located under the peripheral region of the pellicle body, and the pellicle frame is configured to support the pellicle body.

20 Claims, 41 Drawing Sheets

PELLICLE FOR A REFLECTIVE MASK AND REFLECTIVE MASK ASSEMBLY INCLUDING THE SAME

CROSS-REFERENCE TO RELATED APPLICATION

This application claims benefit to Korean Patent Application No. 10-2015-0125603, filed on Sep. 4, 2015, in the Korean Intellectual Property Office, the disclosure of which is incorporated herein in its entirety by reference.

BACKGROUND

Inventive concepts relate to pellicles and a mask assemblies including the same, and more particularly, to pellicles for a reflective mask and reflective mask assemblies including the same.

As an integration degree of a semiconductor device becomes higher, development of an exposure device having extreme ultra violet (EUV) light as an optical source for purposes of improving resolution is desired. The EUV light has a shorter wavelength than a deep ultra violet (DUV) light. The EUV light exposure devices may use a reflective mask using a reflection characteristic of the EUV light.

Conventionally, the reflective masks may be contaminated by particles during an exposure process using the EUV light exposure devices. As a result, pellicles are disposed on reflective masks to protect the reflective masks.

SUMMARY

Inventive concepts provide pellicles for reflective masks, wherein the pellicles are capable of protecting the reflective masks.

Inventive concepts provide a reflective mask assembly including a pellicle for a reflective mask.

According to example embodiments, there is provided a pellicle for a reflective mask, the pellicle comprising a pellicle body, a light shielding pattern, a grating pattern, and a pellicle frame. The pellicle body includes a central region and a peripheral region, the peripheral region surrounding the central region, and the pellicle body including a first surface and a second surface opposing each other. The light shielding pattern formed on the peripheral region of the pellicle body. The grating pattern formed on the light shielding pattern, and the pellicle frame formed on the first surface of the pellicle body, and the pellicle frame configured to support the pellicle body.

In another example embodiment, there is provided a reflective mask assembly comprising a reflective mask, and a pellicle. The reflective mask including a pattern region and a black border region, the black border region surrounding the pattern region. The pellicle may be formed on top of the reflective mask, wherein the pellicle includes a pellicle body, a pellicle frame, a light shielding pattern, and a grating pattern. The pellicle body including a first surface and a second surface opposing each other, the pellicle body configured to protect the pattern mask. The pellicle frame may be formed over the black border region of the reflective mask, the pellicle frame formed on the second surface of the pellicle body, and the pellicle frame configured to support the pellicle body. The light shielding pattern may be formed on the first surface of the pellicle body, the light shielding pattern formed over the black border region. The grating pattern may be formed on the light shielding pattern.

According to an example embodiment, a reflective mask assembly may comprise a reflective mask and a pellicle. The reflective mask may include a black border region, and the pellicle may include a light shielding pattern and a grating pattern. The light shielding pattern may be formed on a peripheral region of the pellicle, and the grating pattern may be formed on the light shielding pattern. The light shielding pattern and the grating pattern may correspond to the black border region.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF EXAMPLE EMBODIMENTS

Figure 1:
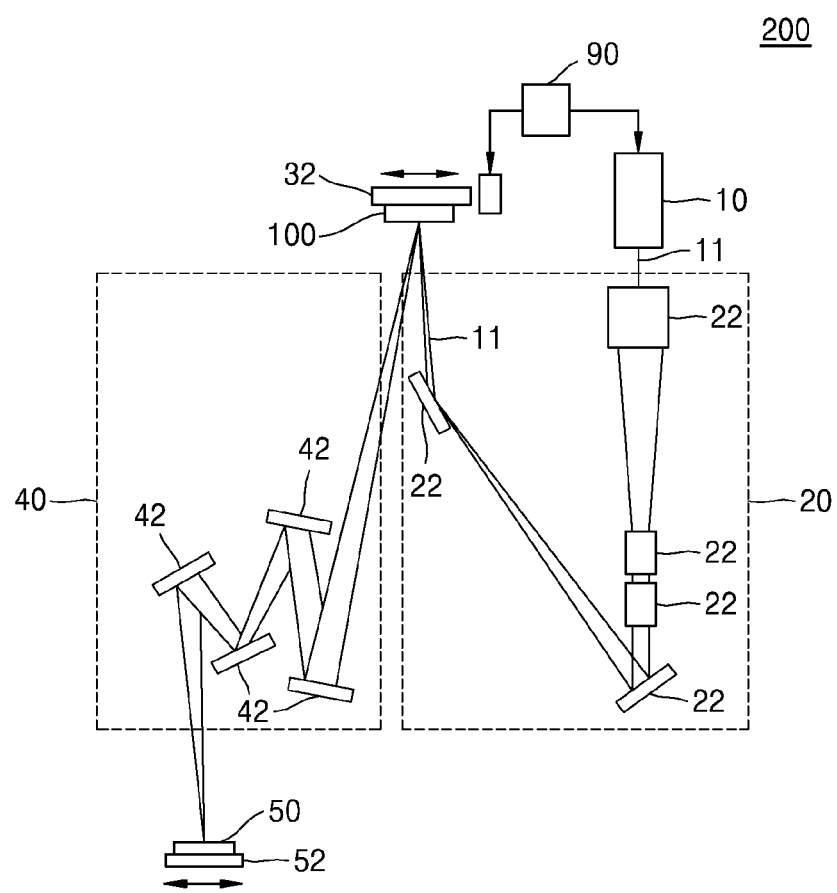
FIG. 1 is a schematic view of an extreme ultra violet (EUV) light exposure device, according to an example embodiment of inventive concepts.

Hereinafter, inventive concepts will now be described fully with reference to the accompanying drawings, in which example embodiments are shown.

Example embodiments may, however, be embodied in many different forms and should not be construed as limited to the embodiments set forth herein. Rather, these example embodiments are provided so that this disclosure will be thorough and complete, and will fully convey the scope of example embodiments of inventive concepts to one of ordinary skill in the art. Sizes or thickness of components in the drawings may be exaggerated for convenience of explanation and/or clarity. In other words, since sizes and thicknesses of components in the drawings are arbitrarily illustrated for convenience of explanation, the example embodiments are not limited thereto. Like reference characters and/or numerals in the drawings denote like elements, and thus their description may not be repeated.

FIG. 1 is a schematic view of an extreme ultra violet (EUV) light exposure device 200, according to an example embodiment of inventive concepts.

In detail, the EUV light exposure device 200 may include at least an optical source 10, a condenser 20, a projector 40, and a controller 90. The optical source 10 may generate EUV light, for example. The EUV light may have a wavelength of 100 nm (nanometer) or less. In an example embodiment, the optical source 10 may generate EUV light having a wavelength of 13.5 nm. The optical source 10y, however, may also generate an undesired deep ultraviolet (DUV) light, for example. The DUV light may have a wavelength of 100 nm or more and 300 nm or less. The condenser 20 guides light 11 generated by the optical source 10 towards the reflective mask 100. The reflective mask 100 may be disposed on a mask stage 32.

The condenser 20 includes optical elements 22, for example, a lens or a mirror. The condenser optics 22 collects and reflects the light 11 toward the reflective mask 100. The light 11 may be output from the condenser 20, and may be directed in an oblique orientation to the reflective mask 100. The mask stage 32 may shift the reflective mask 100 along a scanning direction of the reflective mask 100. The optical source 10 and the mask stage 32 may be controlled by the controller 90.

The light 11 obliquely directed to the reflective mask 100 may be reflected by the reflective mask 100, and be obliquely directed to the projector 40. The projector 40 projects a mask pattern (absorption pattern) of the reflective mask 100 onto a substrate 50. The substrate 50 may be located on a substrate stage 52. The substrate 50, for example, may be a wafer having an integrated circuit (IC). The substrate 50 may be coated with a photoresist capable of reacting to light. The substrate stage 52 may shift the substrate 50 in order to change an exposure region (or an exposure position) of the substrate 50.

The projector 40 includes reflective optical elements 42, for example, a lens. The reflective optical elements 42 may project the reflective mask's 100 mask pattern onto the substrate 50 by using the light 11 that is obliquely reflected by the reflective mask 100. The reflective optical elements 42 may reduce the size of the mask pattern on the reflective mask 100 according to a prescribed reduction value, for example, a reduction value of 4×, 6× or 8×.

Figure 2:
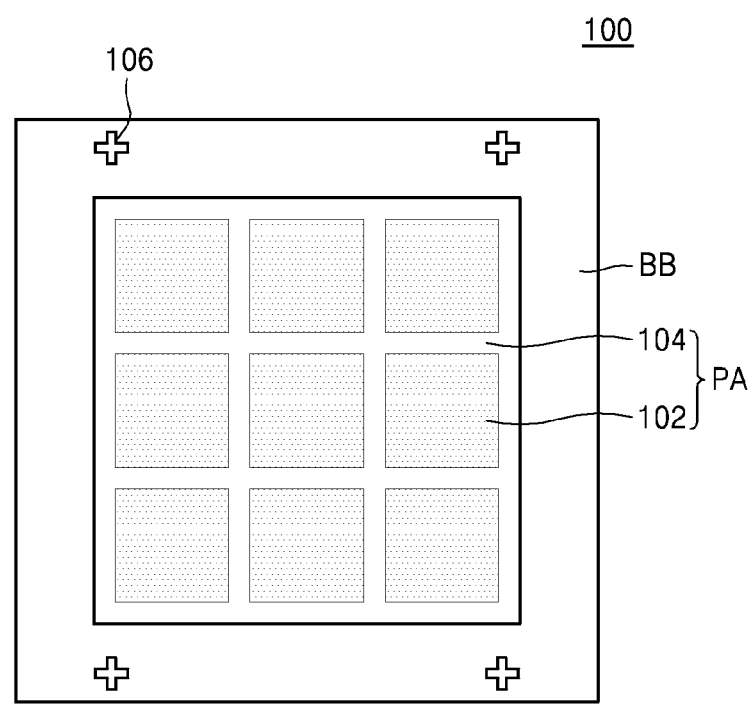
FIG. 2 is a plan view illustrating a schematic configuration of a reflective mask applied to the EUV light exposure device of FIG. 1.

FIG. 2 is a plan view illustrating a schematic configuration of the reflective mask 100 applied to the EUV light exposure device 200 of FIG. 1.

In further detail, the reflective mask 100 may include a pattern region PA and a black border region BB. The pattern region PA may include a main pattern region 102 and an auxiliary pattern region 104. The main pattern region 102 may be for transferring a main pattern to a chip region on the substrate 50 (of FIG. 1) (e.g., a wafer). The main pattern is for constituting an integrated circuit. The auxiliary pattern region 104 may be for transferring an auxiliary pattern to a scribe line region of the substrate 50.

The black border region BB may surround the pattern region PA, and the black border region BB may not include any patterns. The black border region BB may include reference marks 106. For example, black border region BB illustrated in FIG. 2 includes four reference marks 106, but the number of reference marks is not limited thereto. The reference marks 106 may be used as reference points (e.g., origins of a coordinate system) to indicate positions of defects, which may be generated during a formation process of thin films constituting the reflective mask 100.

Figure 3A:
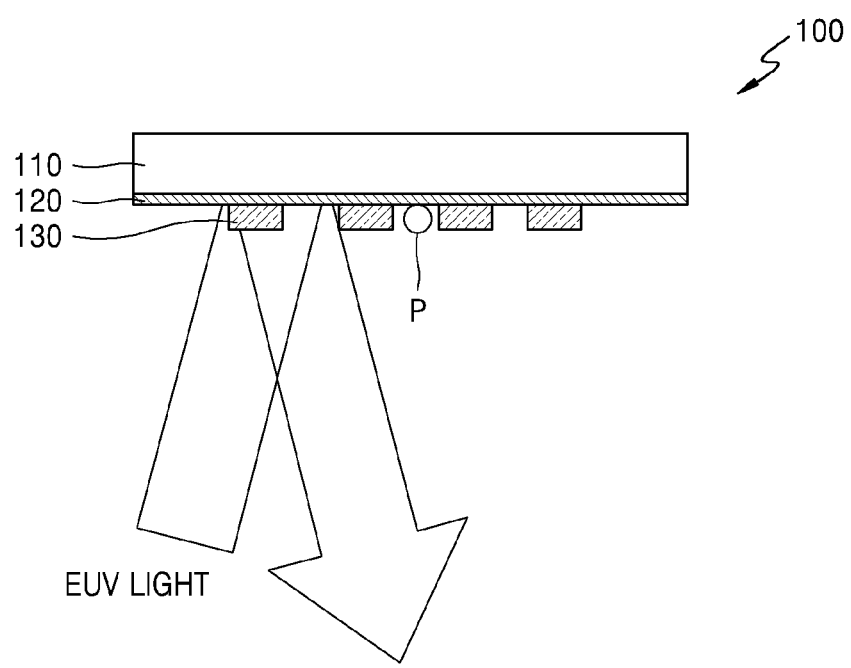
FIGS. 3A and 3B are schematic views illustrating an exposure process using the EUV light exposure device of FIG. 1.
Figure 3B:
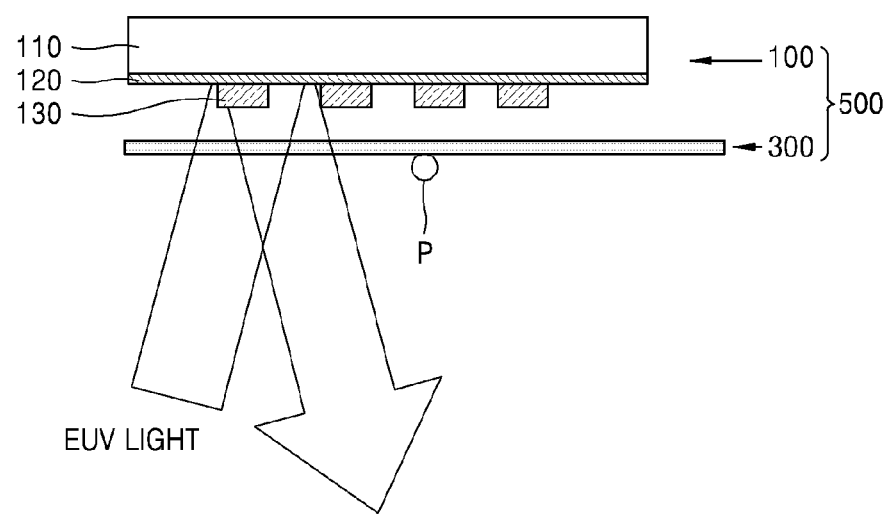

FIGS. 3A and 3B are schematic views illustrating an exposure process using the EUV light exposure device 200 of FIG. 1.

In further detail, FIG. 3A illustrates an exposure process by EUV light by using only a reflective mask 100. Whereas, FIG. 3B illustrates an exposure process by EUV light by using a reflective mask assembly 500 including a reflective mask 100 and a pellicle 300 protecting the reflective mask 100.

The reflective mask 100 may include a mask substrate 110 (a reticle substrate), a reflection layer 120, and absorption patterns 130. The mask substrate 110 may be formed of glass or quartz. The reflection layer 120 may be formed on the mask substrate 110, and reflect any incident light. In other words, as illustrated in FIGS. 3A and 3B, the absorption patterns 130 may be formed on the reflection layer 120, and the portions of the reflection layer 120 between the absorption patterns 130 may be exposed.

For example, the reflection layer 120 may be formed of a molybdenum (Mo)/silicon (Si) layer. The Mo/Si multi-layer may be formed of multiple layers of Mo/Si, for example, 30 to 60 layers of Mo/Si. The Mo/Si multi-layer may be a layer having a structure of forming the Mo layer on the Si layer, and periodically laminating them a plurality of times. Alternatively, for example, the reflection layer 120 may be formed of a Mo compound/Si compound layer, a ruthenium (Ru)/Si layer, a beryllium (Be)/Mo layer, or an Si/niobium (Nb) layer, rather than the Mo/Si layer. A capping layer 122 of FIG. 14, for example, may be formed on the reflection layer 120 to protect the reflection layer 120. Whereas, the capping layer 122 of FIG. 4, may be formed of for example, ruthenium oxide (RuO$_2$). In some cases, the capping layer 122 of FIG. 4 may be omitted.

Still referring to FIGS. 3A and 3B, the absorption patterns 130 may be formed of inorganic materials or metals. The absorption patterns 130 may be mainly formed of a tantalum (Ta) compound. For example, the absorption patterns 130 may be formed of tantalum nitride (TaN), tantalum boron nitride (TaBN), and tantalum boron oxy-nitride (TaBON). However, the absorption patterns 130 may also be formed of an inorganic material that are opaque to light, and/or the absorption patterns 130 may be formed of chromium (Cr), chromium oxide (CrO), nickel (Ni), copper (Cu), molybdenum (Mo), aluminum (Al), titanium (Ti), uranium (U), and ruthenium (Ru). An anti-reflection coating (ARC) layer (not shown), for example, may be formed on the absorption patterns 130. In some example embodiments, the ARC layer may be omitted.

As illustrated in FIG. 3A, when a particle P exists on the reflective mask 100, the EUV light (or the INN light) may be scattered, or the intensity of a reflected light may be reduced due to the particle P. As a result, an error may occur during an exposure process. For example, the absorption patterns 130 of the reflective mask 100, which are transferred to the substrate 50 of FIG. 1 (e.g., a wafer) may be inaccurate and/or distorted due to the particle P. Therefore, the resultant patterns formed on the substrate 50 of FIG. 1 may be different from the intended patterns (e.g., the absorption patterns 130).

Errors may increase when the particle P exists between the reflection layer 120 and the absorption patterns 130. When the particle P exists in an edge portion of the absorption patterns 130, the reflection layer 120 may be affected by scattering caused by the particle P. Therefore, a contamination factor of a particle needs to be limited and/or prevented from reaching or accumulating on the reflective mask 100, and thereby performing a stable and an accurate exposure process.

Therefore, as illustrated in FIG. 3B, the pellicle 300, which protects the reflective mask 100 may be arranged below the reflective mask 100. In other words, as illustrated in FIG. 3B, an exposure process may be performed by using the reflective mask assembly 500, which includes the reflective mask 100 and the pellicle 300.

The pellicle 300 may limit and/or prevent the particle P from reaching and/or accumulating on the lower surface of a reflective mask. Therefore, an error due to a contamination of the reflective mask 100 may decrease during an exposure process, and a stable exposure process may be performed by using the reflective mask assembly 500.

Meanwhile, the pellicle 300 used in the reflective mask assembly 500 needs to have a high transmission rate of EUV light so that the EUV light exposure device 100 of FIG. 1 may reliably perform an exposure process by using EUV light. Therefore, the pellicle 300 and the reflective mask assembly 500 including the same are further discussed in detail below.

Figure 4:
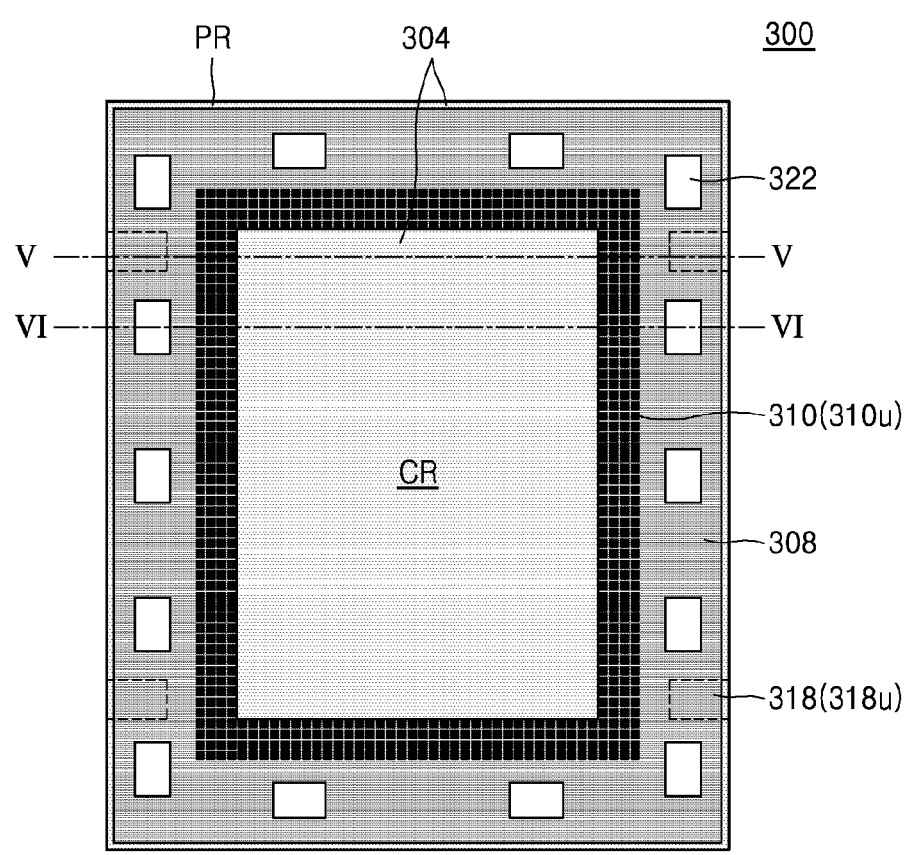
FIG. 4 is a plan view of a pellicle for a reflective mask according to an example embodiment of inventive concepts.
Figure 5:
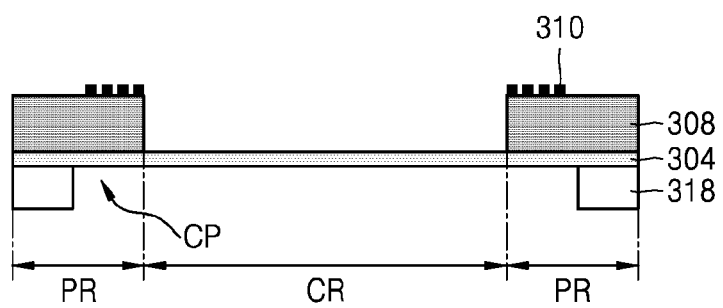
FIGS. 5 and 6 are respective sectional views of V-V and VI-VI of FIG. 4, respectively.
Figure 6:
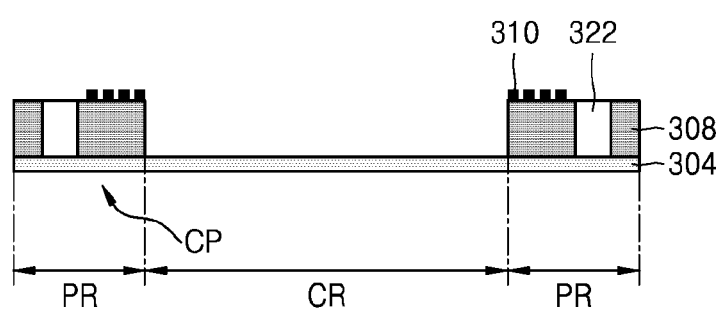

FIG. 4 is a plan view of a pellicle 300 according to an example embodiment of an aspect of inventive concepts. FIGS. 5 and 6 are respective sectional views of V-V and VI-VI of FIG. 4.

Referring to FIG. 4, in conjunction with FIGS. 5 and 6, the pellicle 300 may include a pellicle body 304, a light shielding pattern 308, a grating pattern 310, and a pellicle frame 318. The pellicle body 304 may include a central region CR and a peripheral region PR. The peripheral region PR surrounds the central region CR. The peripheral region PR may surround part of or the whole of the central region CR.

Figure 14:
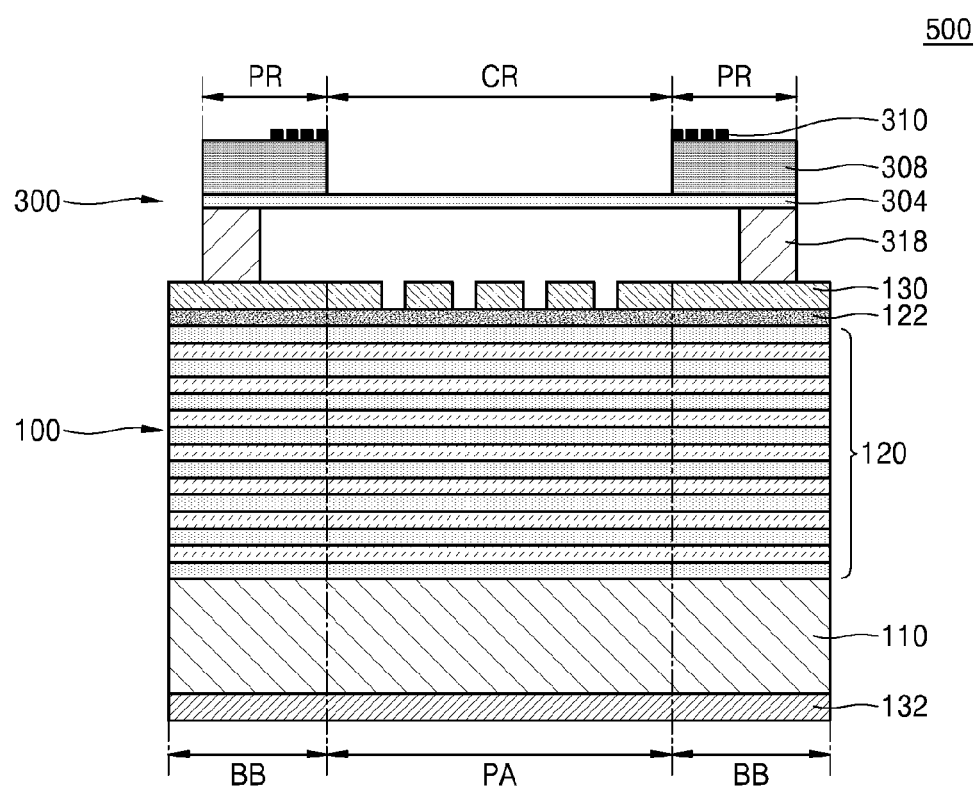
FIG. 14 is a sectional view of a reflective mask assembly according to an example embodiment of inventive concepts.

The central region CR of the pellicle body 304 may correspond to a pattern region PA of the reflective mask 100 in the reflective mask assembly 500, as illustrated in FIG. 14. The peripheral region PR of the pellicle body 304 may correspond to a black border region BB of the reflective mask 100 in the reflective mask assembly 500, as illustrated in FIG. 14, which is further discussed below.

The pellicle body 304 may be formed of a material having a high transmission rate of the EUV light. The pellicle body 304 may include a silicon layer and/or a polysilicon layer. A transmission rate (transmittance) and components of the pellicle body 304 will be described in further detail later.

The light shielding pattern 308 is formed on the peripheral region PR of the pellicle body 304. The light shielding pattern 308 may be formed on the whole of the peripheral region PR. The light shielding pattern 308 may surround the central region CR. The light shielding pattern 308 may be formed on a corner portion CP of the pellicle body 304. The light shielding pattern 308 may be patterns blocking the EUV light and the DUV light.

The light shielding pattern 308 may be formed of silicon nitride (SiN). However, inventive concepts are not limited to SiN, and any material may be used to form the light shielding pattern 308 as long as the material can block the EUV light and the DUV light. In an example embodiment, a thickness of the light shielding pattern 308 may be 60 nm (nanometer) or more. In an example embodiment, a thickness of the light shielding pattern 308 may be 100 nm or more.

As illustrated in FIG. 14, and further discussed below, the light shielding pattern 308 may be formed on a portion corresponding to the black border region BB of the reflective mask 100. Optical density of the substrate 50 of FIG. 1, according to light reflected from the peripheral region PR of the pellicle 300 during an exposure process may be lowered due to the light shielding pattern 308.

The light shielding pattern 308 may include alignment patterns 322. The alignment patterns 322 may be patterns for alignment with the reflective mask 100, as illustrated in FIG. 4. The alignment patterns 322 may be spaced apart from each other. The alignment patterns 322 may be grooves formed in the light shielding pattern 308.

The grating pattern 310 may be formed on the light shielding pattern 308. The grating pattern 310 may be formed of a plurality of grating pattern units 310u, which are spaced apart from each other. The grating pattern 310 may be dot patterns and/or checked patterns.

Figure 19A:
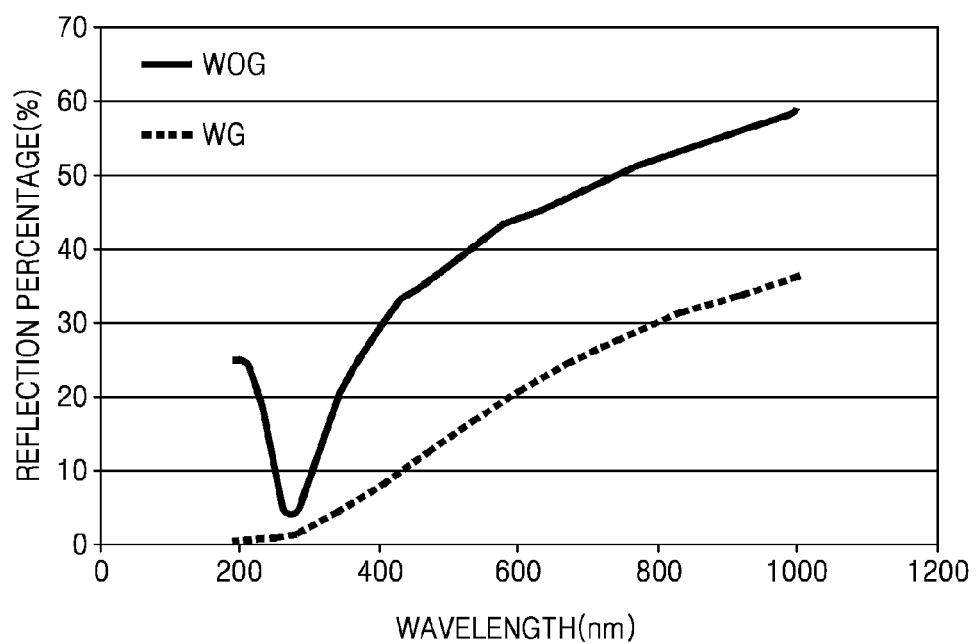
FIGS. 19A and 19B are views illustrating the amount of light reflected by a grating pattern of FIG. 18.
Figure 19B:
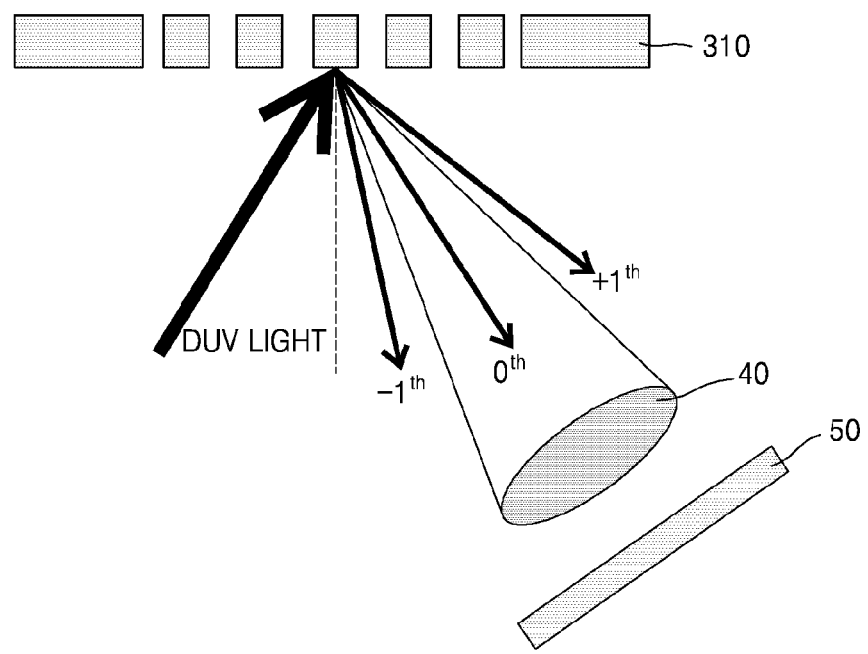

The grating pattern 310 may reduce a reflection percentage of the DUV light, as illustrated in FIG. 19A below. The grating pattern 310 may suppress the influence of a reflected light deviating from a wavelength range of the EUV light, for example, the DUV light, on a substrate to be exposed, as illustrated in FIG. 19B below.

The grating pattern 310 may suppress the influence of the reflected light deviating from a wavelength range of the EUV light, for example, a reflected light of 100 nm to 15 μm (micrometer) wavelength, on a substrate to be exposed. The grating pattern 310 may include a metal layer and/or a metal oxide layer, but not limited thereto. The grating pattern 310 may include a material other than the metal layer and/or the metal oxide layer.

The pellicle frame 318 supporting the pellicle body 304 may be located under the peripheral region PR of the pellicle body 304. The pellicle frame 318 may include a silicon layer, and may include a plurality of pellicle frame units 318u, which are spaced apart from each other, as illustrated in FIG. 4. The pellicle frame 318 may be formed under the corner portion CP of the pellicle body 304.

Figure 7:
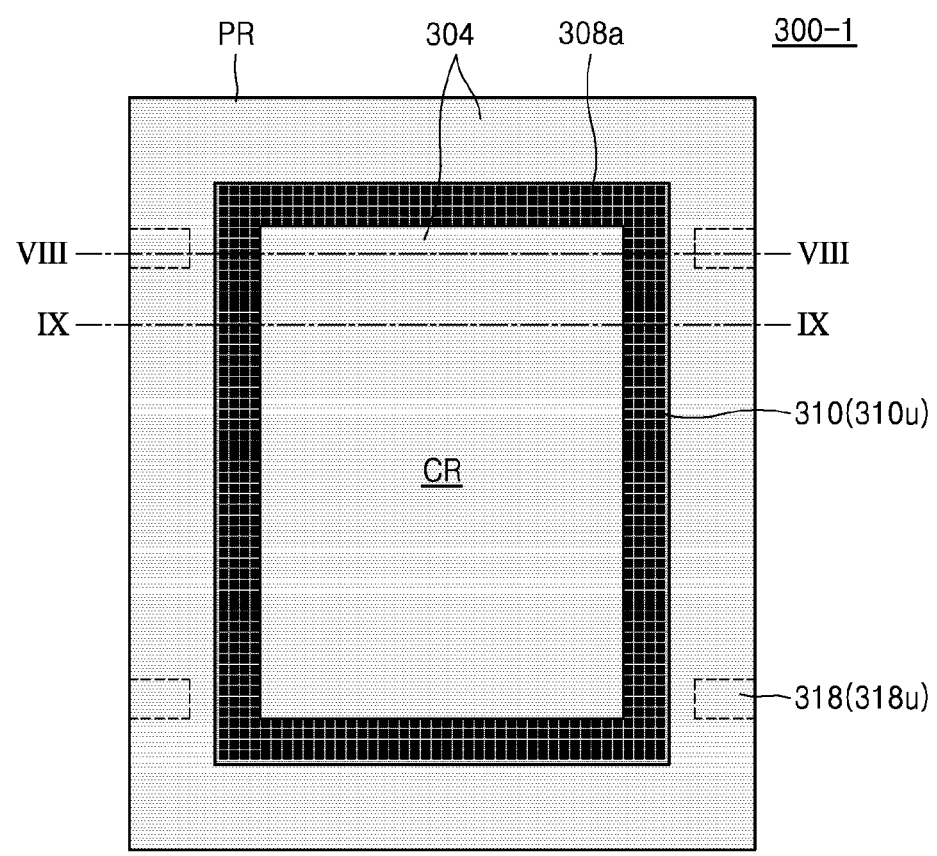
FIG. 7 is a plan view of a pellicle for a reflective mask according to an example embodiment of inventive concepts.
Figure 8:
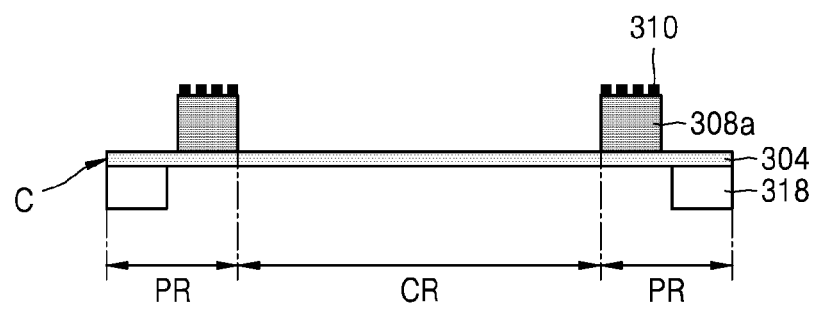
FIGS. 8 and 9 are respective sectional views of VIII-VIII and IX-IX of FIG. 7, respectively.
Figure 9:
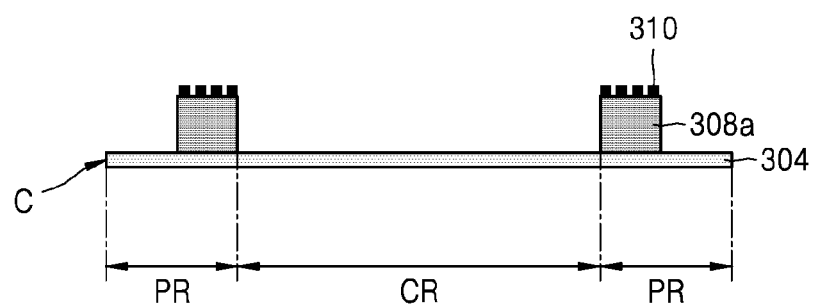

FIG. 7 is a plan view of a pellicle 300-1 for a reflective mask 100 according to an example embodiment of inventive concepts. FIGS. 8 and 9 are respective sectional views of VIII-VIII and IX-IX of FIG. 7.

Referring to FIG. 7, in conjunction with FIGS. 8 and 9, the pellicle 300-1 for a reflective mask 100 may be the same as the pellicle 300 of FIG. 4 except that a light shielding pattern 308a may be formed on a portion of a peripheral region PR of a pellicle body 304. As such, repeated descriptions of the above example embodiments of FIGS. 4 to 6 are omitted.

The pellicle 300-1 for a reflective mask 100 may include the pellicle body 304, the light shielding pattern 308a, a grating pattern 310, and a pellicle frame 318. The pellicle body 304 may include the peripheral region PR and a central region CR. The peripheral region PR may surround the central region CR.

The light shielding pattern 308a may be formed on a portion of the peripheral region PR of the pellicle body 304. The light shielding pattern 308a may be formed on a portion of the peripheral region PR while surrounding the central region CR. The light shielding pattern 308a may be spaced apart from a corner C of the pellicle body 304. The light shielding pattern 308a may block the EUV light and the DUV light. A component or a thickness of the light shielding pattern 308a may be the same as the light shielding pattern 308a described in FIGS. 4 to 6.

The grating pattern 310 may be formed on the light shielding pattern 308a. The grating pattern 310 may be formed of a plurality of grating pattern units 310u spaced apart from each other. The grating pattern 310 may reflect the EUV light and the DUV light, and may be formed on the entire surface of the light shielding pattern 308a. A component or a thickness of the grating pattern 310 may be the same as the grating pattern 310 described in FIGS. 4 to 6.

The pellicle frame 318 supporting the pellicle body 304 may be located under the peripheral region PR of the pellicle body 304. The pellicle frame 318 may include a plurality of pellicle frame units 318u spaced apart from each other. A component of the pellicle frame 318 may be the same as pellicle frame 318 described in FIGS. 4 to 6. The pellicle frame 318 may be formed under the corner portion CP of the pellicle body 304.

FIGS. 10A through 10F are sectional views illustrating a method of manufacturing a pellicle for a reflective mask 100, according to an example embodiment of inventive concepts.

In detail, FIGS. 10A through 10F are views illustrating a method of manufacturing the pellicle for the reflective mask of FIG. 5.

Figure 10A:
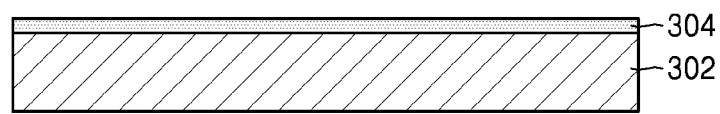
FIGS. 10A through 10F are sectional views illustrating a method of manufacturing a pellicle for a reflective mask, according to an example embodiment of inventive concepts.

Referring to FIG. 10A, a frame substrate 302 is provided to manufacture a pellicle for a reflective mask. The frame substrate 302 may be a silicon substrate. Furthermore, the frame substrate 302 may be a single crystal silicon substrate.

A pellicle body 304 is formed on the frame substrate 302. The pellicle body 304 may include a silicon layer and/or a polysilicon layer. A thickness of the pellicle body 304 may be determined by considering a transmission rate of the EUV light.

Figure 10B:
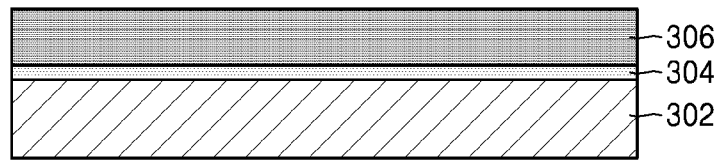

As illustrated in FIG. 10B, a light shielding material layer 306 is formed on the pellicle body 304. The light shielding material layer 306 may include an silicon nitride (SiN) layer.

A thickness of the light shielding material layer 306 may be chosen according to the percent of the EUV light and/or the DIN light to be reflected.

Figure 10C:
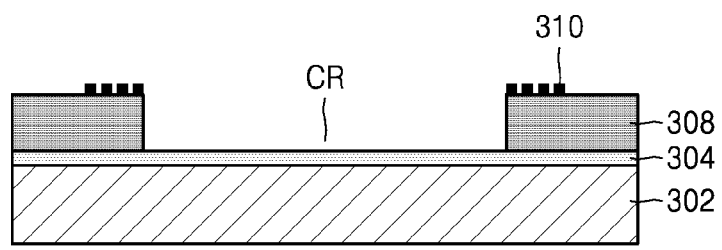

Referring to FIG. 10C, a grating pattern 310 is formed on a partial region of the light shielding material layer 306. Furthermore, a light shielding pattern 308 exposing a central region CR of the pellicle body 304 are formed by patterning the light shielding material layer 306.

Figure 10D:
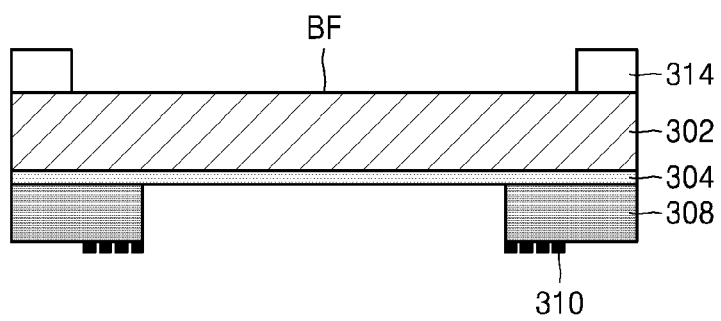

Referring to FIG. 10D, respective mask patterns 314 are formed on a portion of a back surface BF of the frame substrate 302 after reversing the frame substrate 302. The mask patterns 314 are formed to etch a portion of the back surface BF of the frame substrate 302.

Figure 10E:
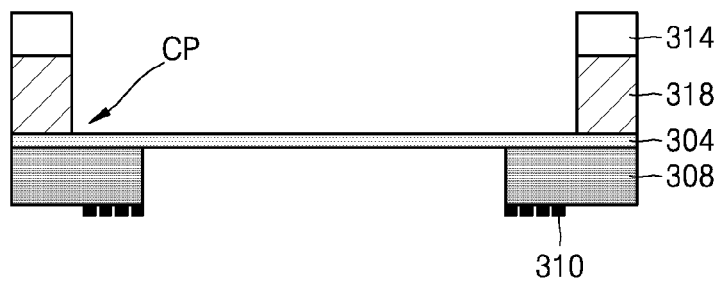

Referring to FIG. 10E, a pellicle frame 318 is formed by etching the frame substrate 302 of FIG. 10D by using the mask patterns 314 as masks0E. The pellicle frame 318 may be formed under a corner portion CP of the pellicle body 304. The frame substrate 302 may be etched by using a dry etching method and/or a wet etching method.

The pellicle body 304 may be exposed when the frame substrate 302 of FIG. 10D is etched. The mask patterns 314 may also be etched when the frame substrate 302 of FIG. 10D is etched. The mask patterns 314 may be additionally etched and removed as needed.

Figure 10F:
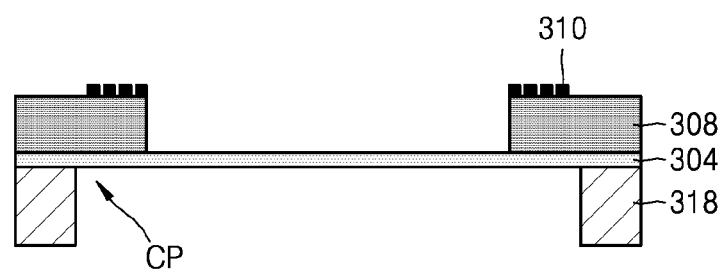

Referring to FIG. 10F, the pellicle body 304, the light shielding pattern 308, the grating pattern 310, and the pellicle frame 318 may be reversed. As such, a pellicle for a reflective mask as illustrated in FIG. 5 may be obtained.

Figure 11A:
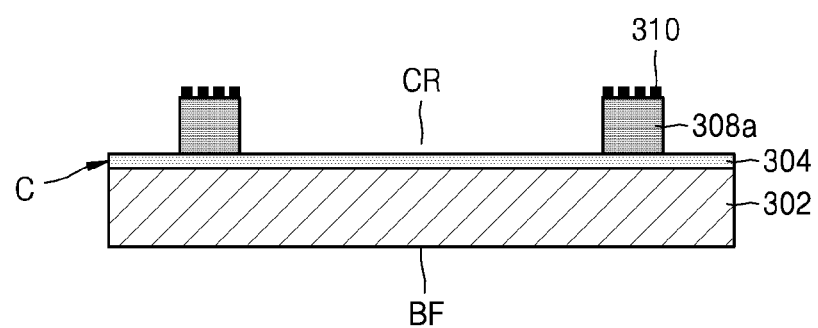
FIGS. 11A through 11C are sectional views illustrating a method of manufacturing a pellicle for a reflective mask, according to an example of inventive concepts.
Figure 11B:
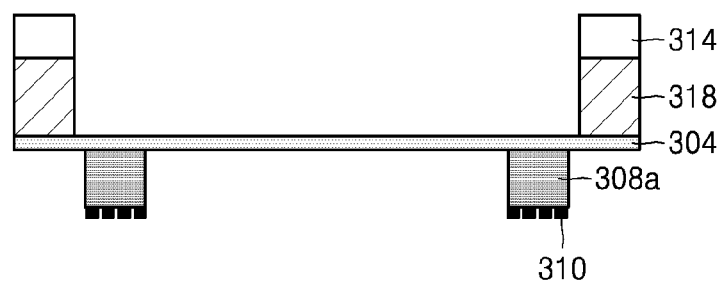
Figure 11C:

FIGS. 11A through 11C are sectional views illustrating a method of manufacturing a pellicle for a reflective mask, according to an example embodiment of inventive concepts.

In detail, FIGS. 11A through 11C illustrate a method of fabricating the pellicle for a reflective mask of FIG. 8. In FIGS. 11A through 11C, same elements as those of FIGS. 10A through 10F are denoted by the same reference numerals, and descriptions thereof will be omitted or simplified.

Referring to FIG. 11A, a pellicle body 304 is formed on a frame substrate 302 as described above in FIGS. 10A and 10B. As illustrated in FIG. 11A, a light shielding pattern 308a is formed on a pellicle body 304, and a grating pattern 310 is formed on the light shielding pattern 308a.

Unlike the light shielding pattern 308a of FIG. 10C, the light shielding pattern 308a of FIG. 11A is spaced apart from a corner C of the pellicle body 304. Still referring to FIG. 11A, a central portion CR of the pellicle body 304 may be determined by forming the light shielding pattern 308a.

Referring to FIG. 11B, respective mask patterns 314 are formed on a portion of a back surface BF of FIGS. 10D and 11A of the frame substrate 302, after reversing the frame substrate 302, as illustrated in FIGS. 10D and 10E.

Referring to FIG. 11B, a pellicle frame 318 is formed by etching the frame substrate 302 of FIG. 11A by using the mask patterns 314 as masks. The etching process of the frame substrate 302 of FIG. 11A may he the same as the descriptions of FIGS. 10D and 10E.

The pellicle body 304 may be exposed when the frame substrate 302 of FIG. 11A is etched. The mask patterns 314 may also be etched when the frame substrate 302 of FIG. 11A is etched. The mask patterns 314 may be additionally etched and removed as needed.

Referring to FIG. 11C, the pellicle body 304, the light shielding pattern 308a, the grating pattern 310, and the pellicle frame 318 are reversed. Therefore, the light shielding pattern 308a may obtain a pellicle for a reflective mask spaced apart from a corner portion C of the pellicle body 304 as illustrated in in FIG. 8.

Figure 12A:
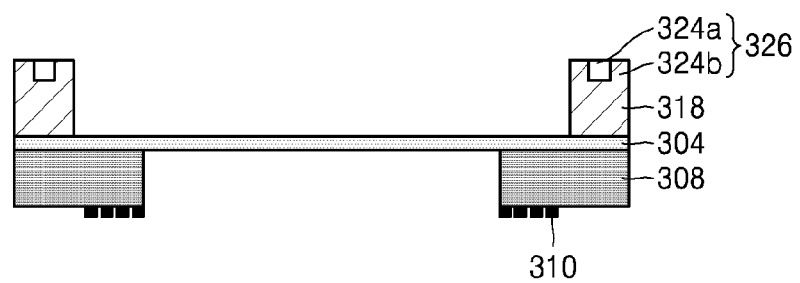
FIGS. 12A through 12C are sectional views illustrating various structures of a pellicle for a reflective mask, according to an example embodiment of inventive concepts.
Figure 12B:
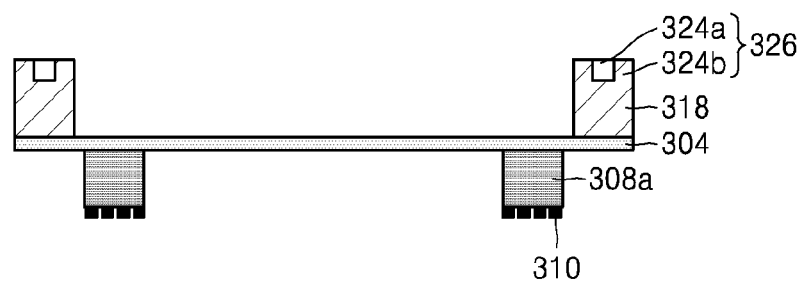
Figure 12C:
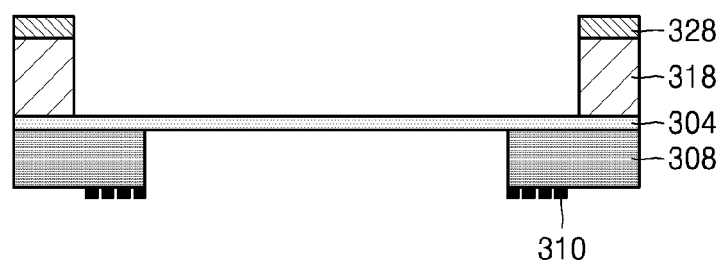

FIGS. 12A through 12C are sectional views illustrating various structures of a pellicle for a reflective mask, according to an example embodiment of an aspect of the inventive concept.

In detail, in FIGS. 12A through 12C, like elements as those of FIG. 5 are denoted by the same reference numerals, and descriptions thereof will be omitted or simplified.

Referring to FIGS. 12A and 12B, the pellicle for a reflective mask of FIGS. 12A and 12B may be the same as that of FIGS. 5 and 8 except that a first projecting and recessed portion 326 is formed on a pellicle frame 318. The first projecting and recessed portion 326 may be formed under the pellicle frame 318. FIGS. 12A and 12B illustrate that the pellicle frame 318 is formed on an upper surface of a pellicle body 304, and the first projecting and recessed portion 326 is formed on a surface of the pellicle frame 318.

The first projecting and recessed portion 326 may be provided by forming a first recessed portion 324a and a first projecting portion 324b on the surface of the pellicle frame 318. The first projecting and recessed portion 326 may be coupled with a second projecting and recessed portion 144 formed on absorption patterns 130 of FIGS. 17A and 17B of a reflective mask as further described below in FIGS. 17A and 17B.

Figure 16A:
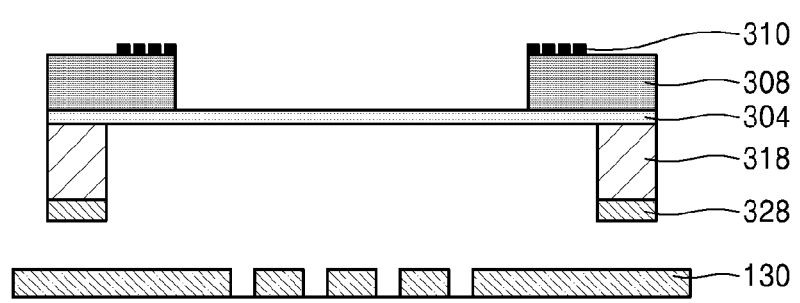
FIGS. 16A and 16B are sectional views illustrating an example of an assembly method of a reflective mask assembly, according to an example embodiment of inventive concepts.
Figure 16B:
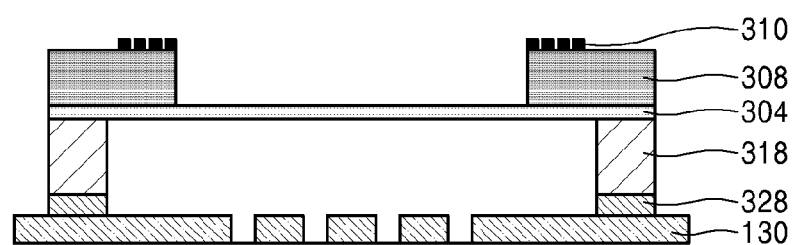

Referring to FIG. 12C, the pellicle for a reflective mask of FIG. 12C may be the same as that of FIG. 5 except that an adhesive layer 328 is formed on the pellicle frame 318. The adhesive layer 328 may be formed of an acryl resin or a silicone-based resin. FIG. 12C illustrates that the pellicle frame 318 is formed on an upper surface of a pellicle body 304, and the adhesive layer 328 is formed on a surface of the pellicle frame 318. The adhesive layer 328 may adhere to and be coupled with absorption patterns 130 of FIGS. 16A and 16B of a reflective mask, as illustrated in FIGS. 16A and 16B.

FIGS. 13A through 13D are sectional views illustrating various structures of a pellicle for a reflective mask, according to an example embodiment of an aspect of the inventive concept.

In detail, in FIGS. 13A through 13D, like elements as those of FIGS. 5 and 8 are denoted by the same reference numerals, and descriptions thereof will be omitted or simplified.

Figure 13A:
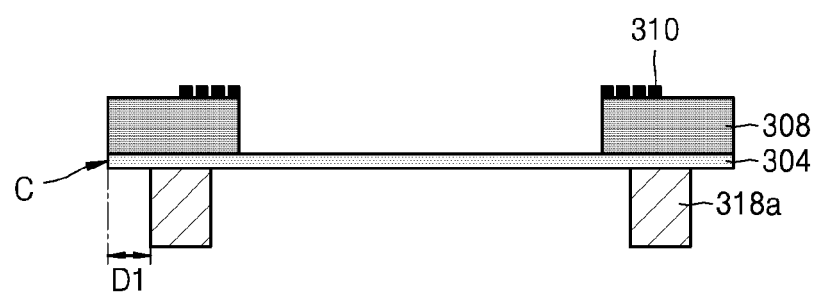
FIGS. 13A through 13D are sectional views illustrating various structures of a pellicle for a reflective mask, according to an example embodiment of inventive concepts.
Figure 13B:
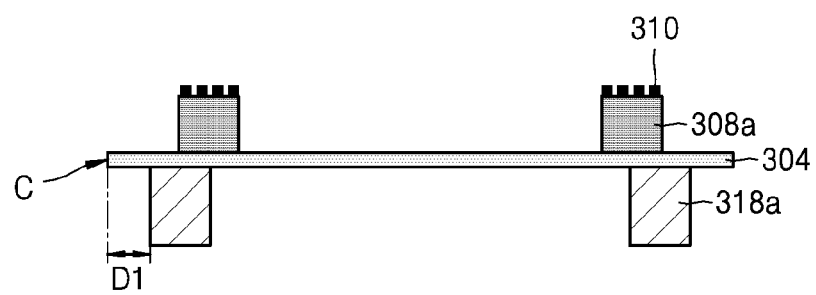

Referring to FIGS. 13A and 13B, the pellicle for a reflective mask of FIGS. 13A and 13B may be the same as that of FIGS. 5 and 8 except that a pellicle frame 318a may be spaced apart from a corner C of a pellicle body 304 by a separation distance D1.

The pellicle frame 318a may be obtained by changing positions of the mask patterns 314 of FIGS. 10D and 11B. The pellicle frame 318a may easily support the pellicle body 304 by being spaced apart from the corner C of the pellicle body 304 by any distance, provided that the pellicle frame 318a is under light shielding pattern 308.

Figure 13C:
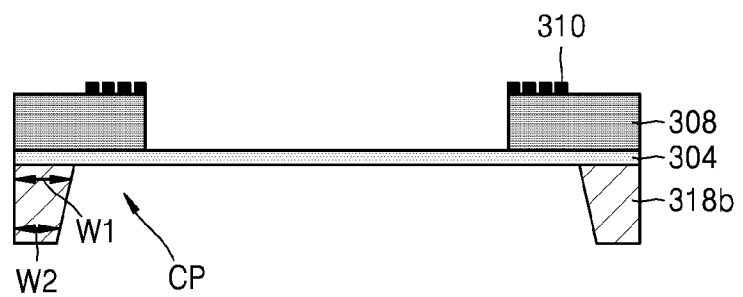
Figure 13D:
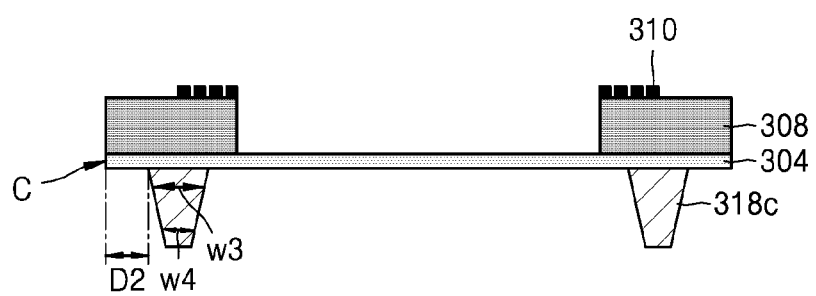

Referring to FIGS. 13C and 13D, the pellicle for a reflective mask of FIGS. 13C and 13D may be the same as that of FIGS. 5 and 8 except that upper widths W1 and W3 of pellicle frames 318b and 318c are wider than lower widths W2 and W4 of the pellicle frames 318b and 318c.

The pellicle frame 318b of FIG. 13C is disposed under a corner portion CP and the upper width W1 is wider than the lower width W2. The pellicle frame 318c of FIG. 13D may be disposed spaced apart from a corner C of the pellicle body 304 by a separation distance D2 and the upper width W3 is wider than the lower width W4.

The pellicle frames 318b and 318c of FIGS. 13C and 13D may be obtained by changing a position or an etching method of the mask patterns 314 of FIGS. 10D and 11B. The pellicle frames 318b and 318c may easily support the pellicle body 304 from under the light shielding pattern 308 by various methods.

Hereinafter, a reflective mask assembly including various types of the pellicle for a reflective mask described above and a reflective mask coupled with the pellicle for a reflective mask will be described, For the sake of convenience, the reflective mask assembly will be described with some example embodiments of the various types of the pellicle for a reflective mask.

FIG. 14 is a sectional view of a reflective mask assembly 500 according to an example embodiment of inventive concepts.

In detail, the reflective mask assembly 500 may include a reflective mask 100 and a pellicle 300, which is located on the reflective mask 100 and protects the reflective mask 100.

The reflective mask 100 may include a pattern region PA and a black border region BB. The black border region BB surrounds the pattern region PA as described above in FIG. 2. The reflective mask 100 may include a mask substrate 110 (a reticle substrate), a reflection layer 120, and absorption patterns 130, as illustrated in FIGS. 3A and 3B. A capping layer 122 may be formed on the reflection layer 120.

A base layer 132 for attaching the mask substrate 110 to the mask stage 32 of FIG. 1 by vacuum may be formed under the mask substrate 110. The base layer 132 may include a chromium nitride layer (CrN). Compositions and components of the mask substrate 110, the reflection layer 120, and the absorption patterns 130 as described above in FIGS. 3A and 3B are omitted.

As described above in FIG. 4, the pellicle 300 may include a pellicle body 304, a light shielding pattern 308, a grating pattern 310, and a pellicle frame 318. The pellicle frame 318 of the pellicle 300 may be located on the black border region BB of the reflective mask 100.

As described above in FIGS. 4 to 6, the pellicle body 304 may include a central region CR and a peripheral region PR. The peripheral region PR surrounding the central region CR. The pellicle body 304 is supported by the pellicle frame 318 and protects the pattern region PA, The light shielding pattern 308 may be located on the pellicle body 304 over the black border region BB.

For the sake of convenience, FIG. 14 illustrates that the light shielding pattern 308 is formed on the entire of the peripheral region PR. However, the light shielding pattern 308 may be formed on a portion of the peripheral region PR adjacent to the central region CR, as illustrated in FIGS. 7 to 9. The grating pattern 310 may be located on the light shielding pattern 308.

The central region CR of the pellicle body 304 may correspond to the pattern region PA of the reflective mask 100. The peripheral region PR of the pellicle body 304 may correspond to the black border region BB of the reflective mask 100. Such that the reflective mask assembly 500 may protect the reflective mask 100 by providing the pellicle 300 on the reflective mask 100.

Figure 15:
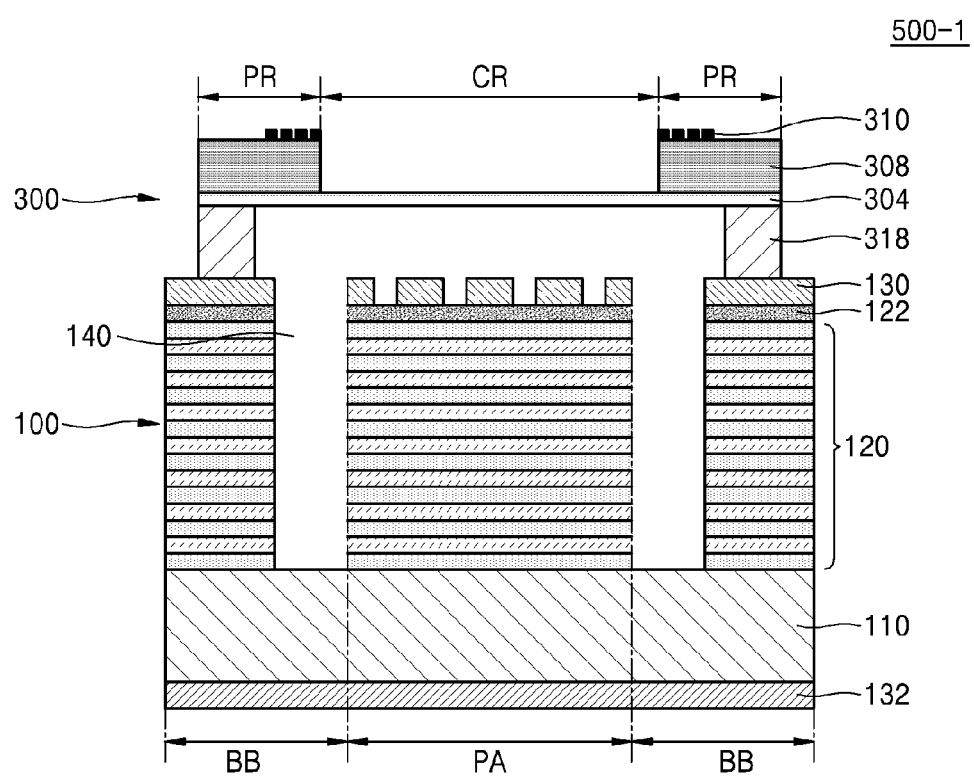
FIG. 15 is a sectional view of a reflective mask assembly according to an example embodiment of inventive concepts.

FIG. 15 is a sectional view of a reflective mask assembly 500-1 according to an example embodiment of inventive concepts.

In detail, still referring to FIG. 15, the reflective mask assembly 500-1 may be the same as the reflective mask assembly 500 of FIG. 14B except that grooves 140 are formed in the reflective mask 100. In FIG. 15, like elements as those of FIG. 14 are denoted by the same reference numerals, and descriptions thereof will be omitted or simplified.

The reflective mask assembly 500-1 of FIG. 15 may include the reflective mask 100 and a pellicle 300, which is located on the reflective mask 100 and protects the reflective mask 100. The reflective mask 100 includes the grooves 100.

The reflective mask 100 may include a pattern region PA and a black border region BB. The black border region BB surrounds the pattern region PA. The reflective mask 100 may include a mask substrate 110 (a reticle substrate), a reflection layer 120, absorption patterns 130, and a base layer 132. The reflective mask 100 may include the reflection layer 120 and grooves 140 exposing the mask substrate 110 in the absorption patterns 130. The reflection layer 120 forms the black border region BB. The grooves 140 may absorb the EUV light.

Still referring to FIG. 15, the pellicle 300 may include a pellicle body 304, a light shielding pattern 308, a grating pattern 310, and a pellicle frame 318. The pellicle frame 318 of the pellicle 300 may be located on the black border region BB of the reflective mask 100. The pellicle body 304 may include a central region CR and a peripheral region PR. The peripheral region PR surrounds the central region CR.

The grooves 140 formed in the reflective mask 100 may be located on a boundary between the central region CR and the peripheral region PR. The pellicle body 304 is supported by the pellicle frame 318 and protects the pattern region PA. The light shielding pattern 308 may be located on the pellicle body 304 over the black border region BB.

The reflective mask assembly 500-1 may easily absorb the EUV light due to the grooves 140, and the pellicle 300 may protect the reflective mask 100.

FIGS. 16A and 16B are sectional views illustrating an example of an assembly method of a reflective mask assembly, according to an example embodiment of inventive concepts.

In detail, FIGS. 16A and 16B illustrate an assembly method of the pellicle 300 on the reflective mask 100. For the sake of convenience, FIGS. 16A and 16B illustrate only the absorption patterns 130 of the reflective mask 100.

The pellicle 300 may include a pellicle body 304, a light shielding pattern 308, a grating pattern 310, and a pellicle frame 318. Furthermore, in FIG. 16A, an adhesive layer 328 may be formed under the pellicle frame 318, as illustrated in FIG. 12C.

The pellicle 300 may be disposed on the reflective mask 100. As illustrated in FIG. 16B, a reflective mask assembly may be completed by disposing the pellicle 300 on the absorption patterns 130 of the reflective mask 100 via the adhesive layer 328.

Figure 17A:
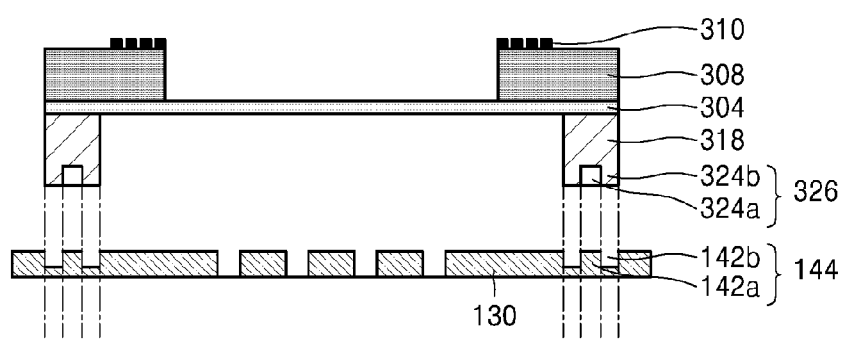
FIGS. 17A and 17B are sectional views illustrating an example of an assembly method of a reflective mask assembly, according to an example embodiment of the inventive concepts.
Figure 17B:
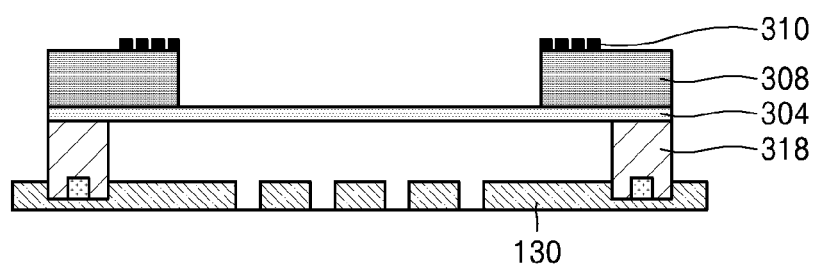

FIGS. 17A and 17B are sectional views illustrating an example of an assembly method of a reflective mask assembly, according to an example embodiment of inventive concepts.

In detail, FIGS. 17A and 17B illustrate an assembly method of the pellicle 300 on the reflective mask 100. For the sake of convenience, FIGS. 17A and 17B illustrate only absorption patterns 130 of the reflective mask 100.

Referring to FIG. 17A, the pellicle 300 may include a pellicle body 304, a light shielding pattern 308, a grating pattern 310, and a pellicle frame 318. Furthermore, in FIG. 17A, the pellicle 300 may include a first projecting and recessed portion 326 under the pellicle frame 318, as illustrated in FIGS. 12A and 12B. The first projecting and recessed portion 326 may include a first recessed portion 324a and a first projecting portion 324b under the pellicle frame 318.

The pellicle 300 may be disposed on the absorption patterns 130 of the reflective mask 100. The absorption patterns 130 may include a second recess portion 144 corresponding to the first projecting and recessed portion 326 of the pellicle 300. The second recess portion 144 may include a second projecting portion 142a and a second recessed portion 142b, respectively, which correspond to the first recessed portion 324a and the first projecting portion 324b of the pellicle 300.

Therefore, as illustrated in FIG. 17B, a reflective mask assembly may be completed by coupling the first projecting and recessed portion 326 of the pellicle 300 with the second recess portion 144 of the absorption patterns 130 in the reflective mask 100.

Figure 18:
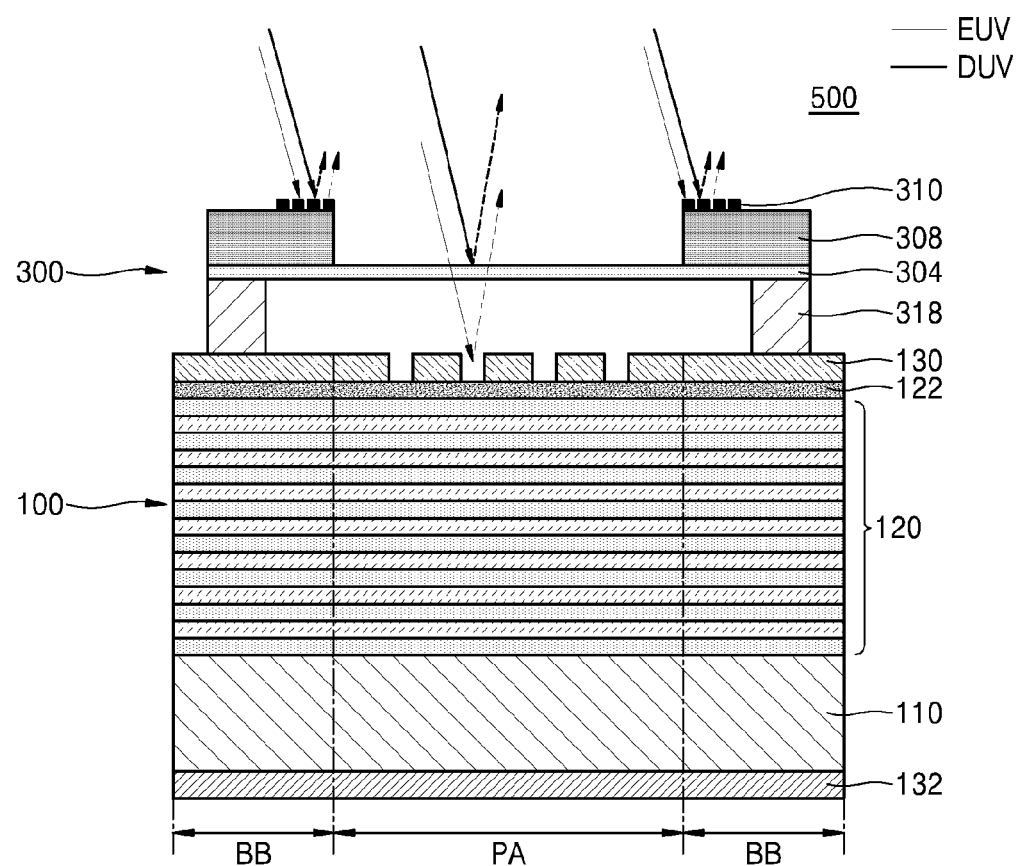
FIG. 18 is a sectional view illustrating light incident to and reflected by a reflective mask assembly of FIG. 14.

FIG. 18 is a sectional view illustrating light incident to and reflected by the reflective mask assembly of FIG. 14, and FIGS. 19A and 19B are views illustrating the amount of light reflected by the grating pattern of FIG. 18.

In detail, in FIG. 18, like elements as those of FIG. 14 are denoted by the same reference numerals, and descriptions thereof will be omitted or simplified. The EUV light and the DUV light may be directed to a top surface of a pellicle 300. The pellicle 300 forms a reflective mask assembly 500. The EUV light and the DUV light may be directed to a reflective mask 100, and may be reflected by the reflective mask 100 and the pellicle 300.

A light shielding pattern 308 may be formed on a pellicle body 304 of the pellicle 300, which corresponds to a black border region BB of the reflective mask 100. Due to the light shielding pattern 308, the optical density of a substrate may be lowered based on the light reflected from a peripheral region PR of the pellicle 300 and the black border region BB of the reflective mask 100.

Still referring to FIG. 18, a grating pattern 310 on the light shielding pattern 308 of the pellicle 300, which corresponds to the black border region BB of the reflective mask 100, may reflect the EUV light and the DUV light.

FIG. 19A is a graph illustrating reflection percentages of the EUV light and the DUV light by the pellicle body 304 of FIG. 18. When the grating pattern 310 exists, the EUV light is barely reflected and a reflection percentage of the DUV light is also relatively low, as indicated by "WG" of FIG. 19A. When the grating pattern 310 does not exist, a reflection percentage of the DUV light is relatively high, as indicated by "WG" of FIG. 19A.

Furthermore, when the DUV light is reflected by the grating pattern 310 disposed on a substrate, as illustrated in FIG. 19B, most of the DIN light may be reflected away from a substrate. In other words, most of (+) primary components and (−) primary components of the DUV light are not directed towards a projector 40, and thus, may not be directed towards to a substrate 50.

Accordingly, the grating pattern 310 may suppress the influence of the DUV light deviating from a wavelength range of the EUV light on the substrate 50. The grating pattern 310 may suppress the influence of reflected light deviating from the wavelength range of the EUV light. For example, a reflected light of a wavelength range of 100 nm or more and 15 µm or less, on the substrate 50 may be suppressed by the grating pattern 310.

Hereinafter, a transmission rate of the EUV light passing through the pellicle body 304 of the pellicle 300 and a reflection percentage of the EUV light reflected by the pellicle body 304 will be described.

Figure 20A:
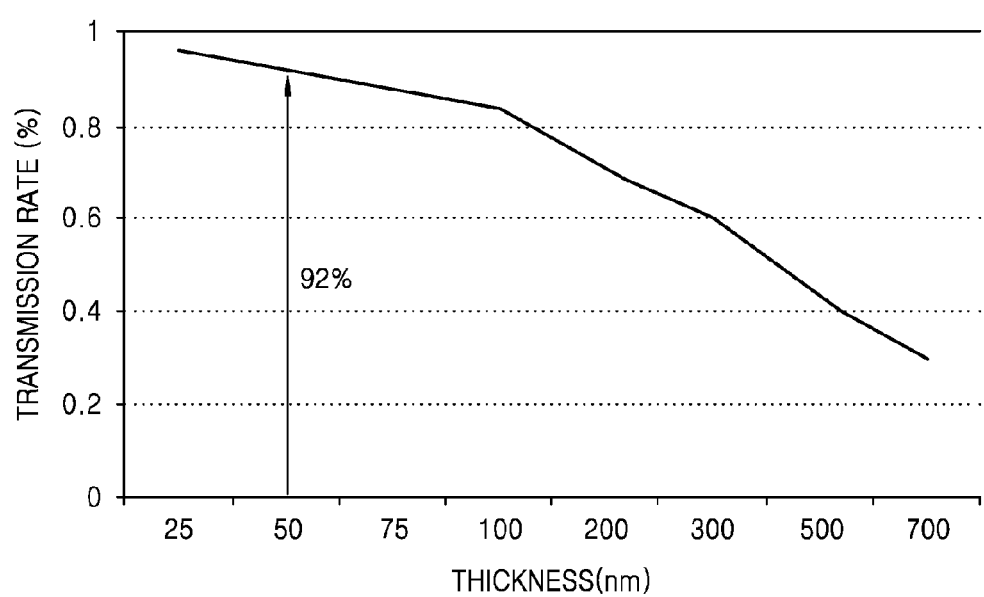
FIG. 20A is a graph illustrating a transmission rate of EUV light according to a thickness of the pellicle body of FIG. 18.
Figure 20B:
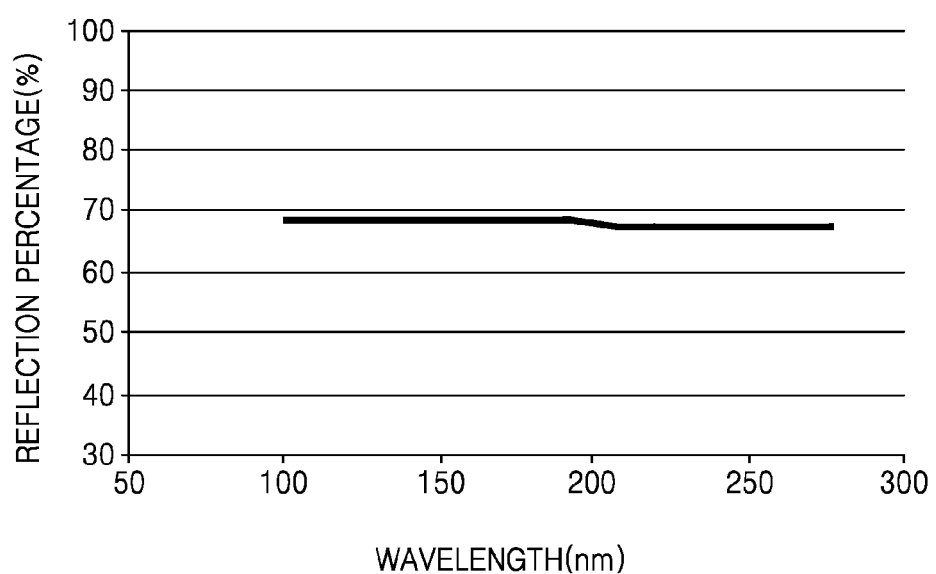
FIG. 20B is a graph illustrating a light reflection percentage of the pellicle body of FIG. 18.

FIG. 20A is a graph illustrating a transmission rate of the EUV light according to a thickness of the pellicle body 304 of FIG. 18. FIG. 20B is a graph illustrating a light reflection percentage of the pellicle body 304 of FIG. 18.

In detail, FIG. 20A is a graph illustrating a transmission rate (transmittance) of the EUV light according to a thickness of the pellicle body 304 when the pellicle body 304 of FIG. 18 includes a silicon layer. As illustrated in FIG. 20A, the greater the thickness of the pellicle body 304, the lower the transmission rate of the EUV light. For example, a transmission rate of the EUV light may be 0.5 or less when a thickness of the pellicle body 304 is about 500 nm.

The transmission rate of the pellicle body 304 may be 85% or more in order to be used as the pellicle 300 for protecting the reflective mask 100. An exposure light passes through the pellicle body 304 twice when the transmission rate of the pellicle body 304 is about 85%. Therefore, the light which is reflected by the reflective mask 100 and transmitted via the pellicle body 304 may be only about 70% of light incident to the pellicle body 304 for the first time.

A transmission rate of the EUV light may be 92% when a thickness of the pellicle body 304 is about 50 nm. When the transmission rate of the EUV light is about 92%, about 85% of the EUV light incident and reflected by the reflective mask 100 may be emitted due to passing through the pellicle body 304 twice. Based on the above, it can be seen that an increased (and/or maximum) thickness of the pellicle body 304 needs to be about 70 nm to 80 nm in order for a transmission rate of the EUV light to be about 85% or more.

As a result, when a thickness of the pellicle body 304 is 70 nm to 80 nm or more, the pellicle body 304 may not function as the pellicle 300, since a large part of the EUV light is absorbed into the pellicle body 304.

The pellicle body 304 is formed of a silicon layer in the present example embodiment; however, components of the pellicle body 304 are not limited thereto. For example, the pellicle body 304 may be formed of a material having a transmission rate (transmittance) similar to or higher than that of the silicon layer to the EUV light.

FIG. 20B is a graph illustrating a light reflection percentage of the pellicle body 304 of FIG. 18 when the pellicle body 304 is formed of a silicon layer and a thickness thereof is 80 nm. As illustrated in FIG. 20B, it can be seen that 70% of the DUV light is reflected when the DUV light is incident to the pellicle body 304. In the pattern region PA (of FIG. 18) of the reflective mask 100, exposure of a substrate to the EUV light may not be affected even if the DUV light is reflected by the pellicle body 304.

A black border region BB may expose a substrate since a wide area of the substrate is exposed by the reflective mask 100. Accordingly, the amount of light reflected due to the black border region BB needs to be reduced (and/or minimized).

Figure 21:
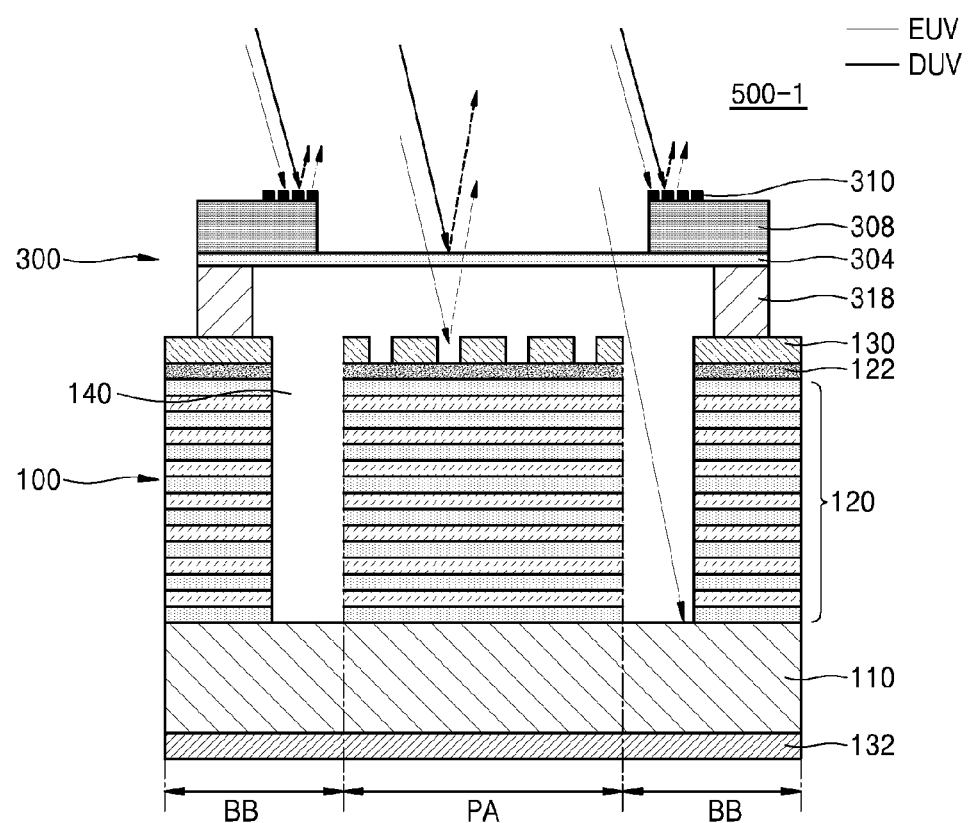
FIG. 21 is a sectional view illustrating light incident to and reflected by the reflective mask assembly of FIG. 15.

FIG. 21 is a sectional view illustrating light directed to and reflected by the reflective mask assembly of FIG. 15.

In detail, in FIG. 21, like elements as those of FIG. 15 are denoted by the same reference numerals, and descriptions thereof will be omitted or simplified. Descriptions of light directed to and reflected by a reflective mask assembly 500-1 of FIG. 21 may be the same as those of the light directed to and reflected by the reflective mask assembly 500 of FIG. 18 except any of the directed light absorbed in the mask substrate 110.

The EUV light and the DUV light directed to a top surface of a pellicle 300 and a reflective mask 100, which form the reflective mask assembly 500-1, may be reflected by the reflective mask 100 and the pellicle 300. Grooves 140 formed in the reflective mask 100 may absorb the light. Due to a light shielding pattern 308, optical density of a substrate may be lowered based on the light reflected from a peripheral region PR of the pellicle 300, and/or a black border region BB of the reflective mask 100.

Furthermore, a grating pattern 310, which is on a light shielding pattern 308 of the pellicle 300 that corresponds to the black border region BB of the reflective mask 100, may suppress the influence of the DUV light deviating from a wavelength range of the EUV light, on the substrate 50 of FIG. 19B.

Figure 22:
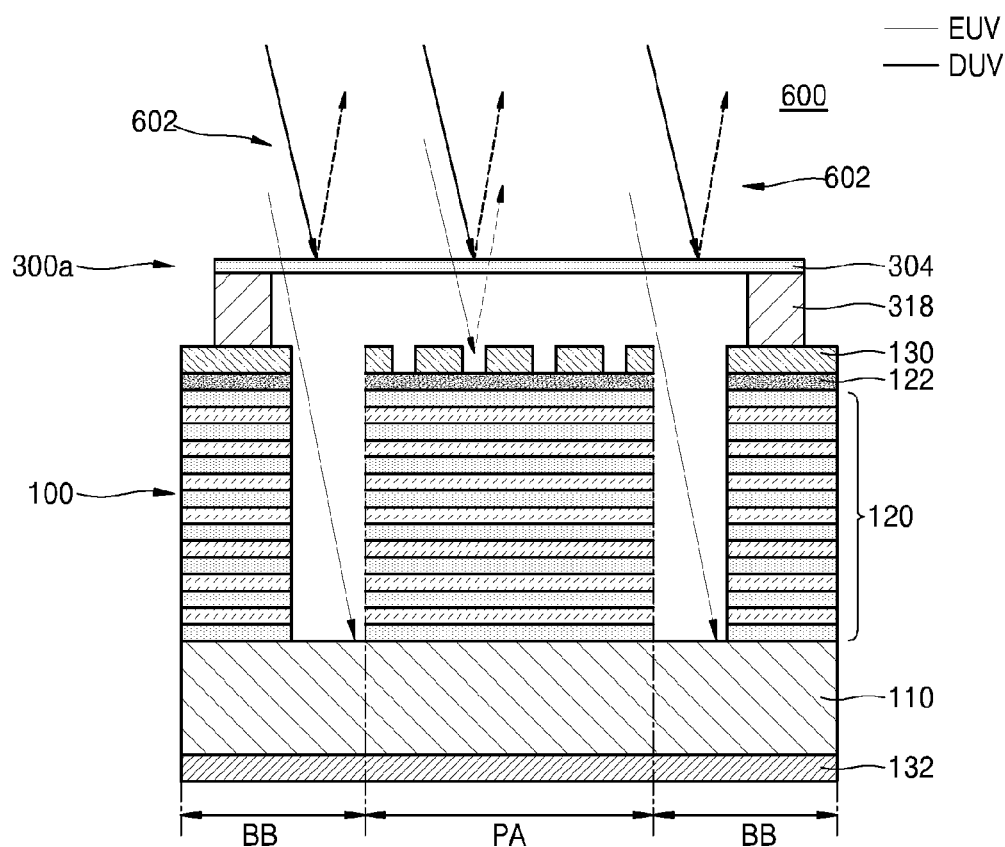
FIG. 22 is a sectional view illustrating light incident to and reflected by a reflective mask assembly of a comparative example compared to FIGS. 18 and 21.

FIG. 22 is a sectional view illustrating light directed to and reflected by a reflective mask assembly 600 of a comparative example corresponding to FIGS. 18 and 21.

In detail, in FIG. 22, like elements as those of FIGS. 18 and 21 are denoted by the same reference numerals, and descriptions thereof will be omitted or simplified. A reflective mask assembly of FIG. 22 may be the same as that of FIG. 21 except that the light shielding pattern 308 of FIG. 21 and the grating pattern 310 of FIG. 21 are not formed on a pellicle for a reflective mask 300a.

In the reflective mask assembly 600, the DUV light, indicated by a reference number 602, may be reflected by a pellicle body 304 of a reflective mask 300a, which corresponds to a black border region BB of a reflective mask 100. Accordingly, the DUV light may affect a substrate. Furthermore, the optical density of the substrate may increase based on the light reflected by the pellicle body 304 corresponding to the black border region BB.

Figure 23:
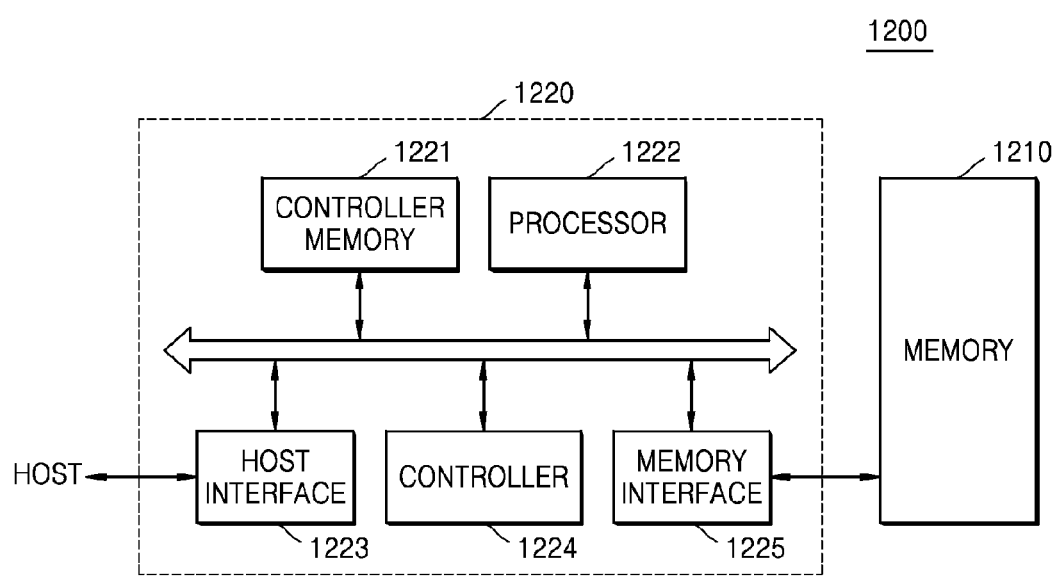
FIG. 23 is a block diagram of a memory card including an integrated circuit manufactured by using a reflective mask assembly, according to example embodiments of inventive concepts.

FIG. 23 is a block diagram of a memory card 1200 including an integrated circuit manufactured by using a reflective mask assembly, according to example embodiments of inventive concepts.

In detail, the memory card 1200 includes a memory controller 1220 generating a command and address signal C/A, and a memory 1210. The memory 1210, for example, a flash memory may include at least one flash memory device. The memory controller 1220 includes a host interface 1223, which transmits or receives a command and address signal to/from a host. The memory controller may also include a memory interface 1225, which transmits or receives the command and address signal again to and from the memory 1210. The host interface 1223, the controller 1224, and the memory interface 1225 may communicate with a controller memory 1221 and a processor 1222 via a common bus. The controller memory 1221 may include but is not limited to, a static random access memory (SRAM). The processor 1222 may include but not limited to a central processing unit (CPU).

The memory 1210 receives a command and address signal from the memory controller 1220, stores data in at least one of memory devices on the memory 1210 as a response, and retrieves the data from at least one of the memory devices. Each of the memory devices includes a plurality of addressable memory cells, and a decoder generating row signals and column signals to access at least one of the addressable memory cells during programming and read operations.

At least one of respective components of the memory card 1200 includes the memory controller 1220, electronic devices 1221 to 1225 included in the memory controller 1220, and the memory 1210. The memory 1210 may include an integrated circuit (IC), which is manufactured by using the reflective mask assemblies 500 and 500-1 according to example embodiment of the inventive concepts.

Figure 24:
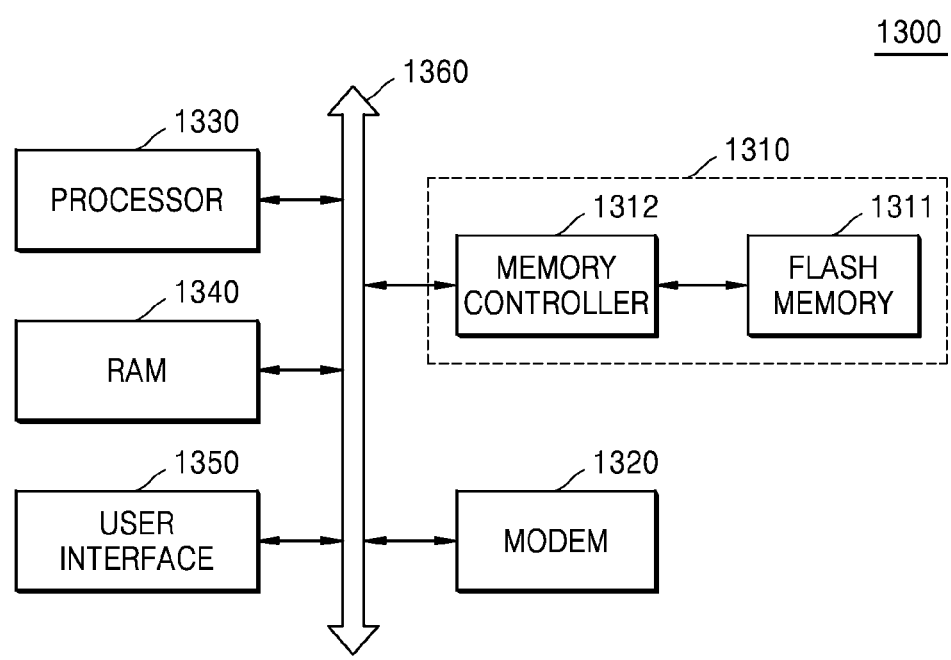
FIG. 24 is a block diagram of a memory system including an integrated circuit manufactured by using a reflective mask assembly according to example embodiments of inventive concepts.

FIG. 24 is a block diagram of a memory system 1300 including an integrated circuit manufactured by using a reflective mask assembly according to example embodiments of the inventive concepts, as discussed in the present application.

In detail, the memory system 1300 may include a processor 1330 such as, including but not limited to, a CPU communicating, a RAM 1340, a user interface 1350, and a modem 1320. The processor 1330, RAM 1340, the user interface 1350, and the modem 1320 communicate via a common bus 1360. Each of the devices transmits and receives a signal to and from a memory card 1310 via the common bus 1360. The memory card 1310 includes a flash memory 1311 and a memory controller 1312.

The memory system 1300 including the processor 1330, the RAM 1340, the user interface 1350, and the modem 1320 as well as the memory card 1310. The memory system 1300 may further include an integrated circuit manufactured by using the reflective mask assemblies 500 and 500-1 according to example embodiments of inventive concepts.

The memory system 1300 may be applied to a variety of electronic application fields, for example, including but not limited to, solid state drives (SSD), complementary metal-oxide semiconductor (CMOS) image sensors (CIS), or computer application chip sets. Memory systems and devices disclosed in the specification may be packaged in any type from among various types of device packages including, for example, including but not limited to, ball grid arrays (BGA), chip scale packages (CSP), a plastic leaded chip carrier (PLCC), a plastic dual in-line package (PDIP), a multi-chip package (MCP), a wafer-level fabricated package (WFP), and a wafer-level processed stock package (WSP).

The processor 1222, the controller 1224 and the processor 1330 are either implemented using hardware components, a processor executing software components, or a combination thereof. Upon execution of one or more algorithms, described in example embodiments of inventive concepts, the aforementioned hardware components, or processor executing software components, result in a special purpose processor. Algorithms, as presented in example embodiments of inventive concepts, may comprise of, including but not limited to, mathematical formulas, flow charts, computer codes, and/or necessary steps, which upon execution result in a special purpose computer that is programmed to perform the disclosed algorithms in example embodiments of inventive concepts.

The one or more aforementioned processors are computer processing devices configured to carry out the program code by performing arithmetical, logical, and input/output operations. Once a program code is loaded into the one or more processors, the one or more processors may be programmed to perform the program code, thereby transforming the one or more processors into special purpose processor(s). Alternatively, or in addition to the processors discussed above, the hardware devices may include one or more Central Processing Units (CPUs), digital signal processors (DSPs), application-specific-integrated-circuits (ASICs), system on chips (SoCs), field programmable gate arrays (FPGAs), or the like. In at least some cases, the one or more CPUs, SoCs, digital signal processors (DSPs), application-specific integrated circuits (ASICs) and field-programmable gate arrays (FPGAs), may generally be referred to as processing circuits and/or microprocessors.

A reflective mask assembly according to an example embodiment of inventive concepts includes a pellicle for a reflective mask, in which the pellicle is located on and protects the reflective mask. The pellicle includes a light shielding pattern located on a peripheral region of a pellicle body corresponding to a black border region of the reflective mask, and a grating pattern located on the light shielding pattern.

Accordingly, optical density of the substrate may be lowered based on light reflected from the peripheral region of the pellicle during an exposure process, due to the light shielding pattern. Furthermore, the grating pattern formed on the light shielding pattern may suppress the influence of reflected light deviating from a wavelength range of EUV light from the peripheral region of the pellicle during an exposure process, for example, the DUV light, on the substrate.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While inventive concepts have been particularly shown and described with reference to example embodiments thereof, it will be understood by one of ordinary skill in the art that variations in form and detail may be made therein without departing from the spirit and scope of the following claims.

What is claimed is:

1. A pellicle for a reflective mask, the pellicle comprising:
    a pellicle body including a central region and a peripheral region, the peripheral region surrounding the central region, the pellicle body including a first surface and a second surface opposing each other;
    a light shielding pattern on the peripheral region of the pellicle body;
    a grating pattern on the light shielding pattern; and
    a pellicle frame on the first surface of the pellicle body, the pellicle frame configured to support the pellicle body.

2. The pellicle of claim 1, wherein the light shielding pattern is disposed on the second surface of the pellicle body.

3. The pellicle of claim 2, wherein the light shielding pattern is spaced apart from a corner of the pellicle body.

4. The pellicle of claim 1, wherein the light shielding pattern includes a plurality of alignment patterns.

5. The pellicle claim 1, wherein the grating pattern includes a plurality of grating pattern units, each of the plurality of grating pattern units spaced apart from respective ones of the plurality of grating pattern units.

6. The pellicle of claim 1, wherein the grating pattern is disposed on the light shielding pattern.

7. The pellicle of claim 1, wherein
    the pellicle frame includes a plurality of pellicle frame units, each of the plurality of pellicle frame units are spaced apart from respective ones of the plurality of pellicle frame units, and
    the pellicle frame is spaced apart from a corner of the pellicle body.

8. The pellicle of claim 1, wherein a projecting portion and a recessed portion are formed on a surface of the pellicle frame.

9. The pellicle of claim 1, wherein the pellicle frame includes an upper width and a lower width, the upper width is wider than the lower width.

10. A reflective mask assembly comprising:
    a reflective mask including a pattern region and a black border region, the black border region surrounding the pattern region; and
    a pellicle on top of the reflective mask, the pellicle including, a pellicle body, the pellicle body including a first surface and a second surface opposing each other, the pellicle body configured to protect the pattern region, a pellicle frame over the black border region and on the second surface of the pellicle body, and the pellicle frame configured to support the pellicle body, a light shielding pattern on the first surface of the pellicle body and over the black border region, and a grating pattern on the light shielding pattern.

11. The reflective mask assembly of claim 10, wherein the reflective mask includes a mask substrate, a reflection layer, and absorption patterns, the reflection layer formed on the mask substrate, and the absorption patterns are formed on the reflection layer, and the pellicle frame is formed on the absorption patterns, the pellicle frame is formed over the black border region.

12. The reflective mask assembly of claim 11, wherein the pellicle further comprises:

a first projecting portion and a first recessed portion, the first projecting portion and the first recessed portion are formed on a first surface of the pellicle frame, and a second projecting portion and a second recessed portion, the second projecting portion coupled with the first projecting portion, and the second recessed portion coupled with the first recessed portion, wherein the absorption patterns are configured to form the coupling.

13. The reflective mask assembly of claim 11, wherein the absorption patterns includes grooves, the grooves expose a region of the mask and a region of the reflective layer formed over the black border region.

14. The reflective mask assembly of claim 10, wherein the pellicle body includes a central region and a peripheral region, the peripheral region surrounds the central region, the central region corresponds to the pattern region of the reflective mask, and the peripheral region corresponds to the black border region of the reflective mask.

15. The reflective mask assembly of claim 10, wherein the light shielding pattern covers an upper portion of the black border region, and the grating pattern is formed on the light shielding pattern.

16. A reflective mask assembly comprising:

a reflective mask including a black border region; and a pellicle including a light shielding pattern and a grating pattern, the light shielding pattern formed on a peripheral region of the pellicle, the grating pattern formed on the light shielding pattern, the light shielding pattern and the grating pattern corresponding to the black border region.

17. The reflective mask assembly of claim 16, wherein the light shielding pattern includes a plurality of alignment patterns.

18. The reflective mask assembly of claim 16, wherein the grating pattern includes a plurality of grating pattern units, each of the plurality of grating pattern units is spaced apart from respective one of the plurality of grating pattern units.

19. The reflective mask assembly of claim 16, wherein the pellicle further comprises:

a pellicle body; and a pellicle frame supporting the pellicle body, the pellicle frame corresponding to the black border region.

20. The reflective mask assembly of claim 19, wherein the pellicle frame includes a plurality of pellicle frame units, each of the plurality of pellicle frame units is spaced apart from respective one of the plurality of pellicle frame units.

* * * * *